United States Patent [19]
Michalicek

[11] Patent Number: 6,040,935
[45] Date of Patent: Mar. 21, 2000

[54] FLEXURELESS MULTI-STABLE MICROMIRRORS FOR OPTICAL SWITCHING

[75] Inventor: M. Adrian Michalicek, Broomfield, Colo.

[73] Assignee: The United States of America as represented by the Secretary of the Air Force, Washington, D.C.

[21] Appl. No.: 09/237,140

[22] Filed: Jan. 25, 1999

[51] Int. Cl.[7] ..................................................... G02B 26/08
[52] U.S. Cl. .......................... 359/198; 359/223; 359/224; 359/871
[58] Field of Search ..................................... 359/196–203, 359/212–214, 221, 223–226, 838, 848, 850, 871, 872

[56] References Cited

PUBLICATIONS

M. A. Michalicek, J. H. Comtois, and H. K. Schriner, "Design and fabrication of optical MEMS using a four-level, planarized, surface–micromachined polysilicon5 process," *Proc. SPIE*, vol. 3276, pp. 48–55, 1998.

*Primary Examiner*—James Phan
*Attorney, Agent, or Firm*—Kenneth E. Callahan

[57] ABSTRACT

An array of micromirror devices is fabricated using standard surface-micromachining techniques such that the reflective mirror surfaces are anchored by a trapped joint rather than by rigid support flexures. These devices are therefore multi-stable in actuation rather than continuous like typical micromirror devices in which the restoring spring force of the flexures is used to balance the force of electrostatic actuation. As a result, the flexureless micromirror can be actuated to specific stable positions that make it ideal for optical switching. Since no direct mechanical connection is required to support the mirror surfaces, these devices can be switched between stable positions in binary fashion and at higher speeds.

3 Claims, 2 Drawing Sheets

FLEXURELESS MULTI-STABLE MICROMIRRORS FOR OPTICAL SWITCHING

STATEMENT OF GOVERNMENT INTEREST

The conditions under which this invention was made are such as to entitle the Government of the United States under paragraph 1(a) of Executive Order 10096, as represented by the Secretary of the Air Force, to the entire right, title and interest therein, including foreign rights.

BACKGROUND OF THE INVENTION

1. Field of the Invention

The field of Microelectromechanical Systems (MEMS) uses a variety of fabrication technologies, such as surface micromachining developed for the integrated circuit industry, to create highly miniaturized mechanical devices (usually 1 $\mu$m to 1 mm in size) on a microelectronic chip. This invention is in the field of microelectromechanical systems (MEMS), and in particular relates to the field of optical MEMS which includes micromirror devices used for a variety of optical applications.

2. Description of the Prior Art

The majority of microelectromechanical systems (EMS) in use today are fabricated in a variety of surface micromachining processes. Surface micromachined devices are formed by the alternate deposition of structural layers to form the device and sacrificial spacer layers to provide mechanical and electrical isolation. Polycrystalline silicon (polysilicon) is the most commonly used structural material and silicon dioxide (oxide) glass is the most commonly used sacrificial material. These layers, formed above a silicon substrate isolated with a layer of silicon nitride, are patterned (using the same advanced photolithography technology employed by the microelectronics industry) to form intricate structures such as motors, gears, mirrors, and various sensors. Cuts made through the oxide layers are used to anchor the upper structural levels to the substrate or to the underlying mechanical structures. At the end of the process, the sacrificial layers are removed using various techniques, such as a hydrofluoric acid release etch, which frees the device to move relative to the substrate. (M. A. Michalicek, J. H. Comtois, and H. K. Schriner, "Design and fabrication of optical MEMS using a four-level, planarized, surface-micromachined polysilicon5 process," *Proc. SPIE*, Vol. 3276, pp. 48–55, 1998.)

The complexity of the micromachines that can be manufactured in a given process is a function of the number of independent layers of structural material the technology provides. A single independent level of structural material limits designers to simple sensors. Geared mechanisms require two releasable structural layers, a Poly-1 layer to form the gears and a Poly-2 layer to form the locking hub above the ground layer (Poly-0). Motorized geared mechanisms require a minimum of three independent levels. Far more complex mechanisms and systems require even more structural layers.

Surface micromachining fabrication of electronics and MEMS is well developed and widely used both privately and commercially. Countless companies, universities, and government agencies have fabricated micromechanical devices for the last 10 years or more. However, only recently has a fabrication process emerged which offers a unique "pin-joint" feature designed for making the hubs of rotating gear mechanisms. The Sandia Ultra-planar Multi-level MEMS Technology (SUMMiT) process is available through Sandia National Laboratories and offers such a feature for creating locking mechanism that are free to rotate about the joint. This same feature has enabled a novel design of micromirror devices that do not require support flexures (as was the standard) to counteract the force of actuation of the device. As a result, the locking joint supports the mirror surface without a rigid assembly and allows the device to switch between multiple stable positions at high speeds.

SUMMARY OF THE INVENTION

In the present invention, a locking "pin-joint" is used to secure a micromirror reflective surface to the underlying support and actuation structure of the device. No support flexures or other support features are rigidly attached to the device. The "pin-joint" works in much the same way as typical large-scale joints such that a thin support column passes through a small window in a support post anchored to the chip. The base of the column contains a mass of material that is larger than the window, thus preventing the column from escaping the hold of the anchored support post. The play in the joint allows the column to tilt around the center of the joint. When a mirror surface is attached to this column and numerous landing pads are placed around the edges of the surface, a flexureless micromirror device is created for optical switching between multi-stable positions. Any fabrication process can be used to realize such a device provided only that a similar "pin-joint" can be created.

DESCRIPTION OF THE PREFERRED EMBODIMENT

All previous designs of micromirror devices have incorporated some form of flexure mechanism that is used to support the mirror surface and suspend it over an address electrode used to electrostatically actuate the mirror surface. The flexures provide a restoring spring force on the mirror that is used to balance the electrostatic force of the address electrode. Therefore, the mirror surface is free to move according to the address potential of the electrode. These flexures are rigidly attached to the mirror surface and allow for a continuous range of actuation between zero and some maximum deflection.

The flexureless micromirror device, however, is a unique form in which no flexure mechanism is used to support the mirror surface. Instead, the mirror surface is supported by a column that is anchored to the structural assembly of the device by a locking "pin-joint" that allows the mirror surface to move freely about the joint. Since no continuous restoring force is supplied by flexures, the mirror surface can be actuated only to stable positions in which the mirror surface rests against some landing pad. When unactuated, the mirror surface is free to move in random motion.

Figures 1A, 1B, 1C, 1D:
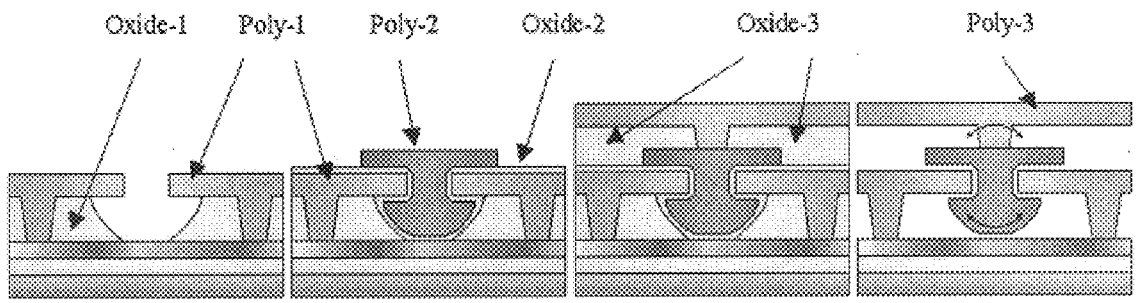
FIGS. 1a–1d show a step-by-step process of the creation of the "pin-joint" micromirror support.

The particular "pin-joint" used for the prototype of the flexureless micromirror devices is a standard feature of the SUMMiT fabrication process. Although this process will be used to explain the joint, it should be noted that any process can be used to create such a joint and similar flexureless devices. The first releasable mechanical layer to be surface micromachined above the substrate is the Poly-1 layer that is used to anchor the support structure. FIG. 1 contains cross-sectional illustrations of the fabrication of a "pin-joint" for flexureless micromirror devices. FIG. 1a illustrates the Poly-1 layer above the first oxide sacrificial layer (Oxide-1) and shows a small window cut to expose the oxide. A timed etch is used to remove a small portion of this sacrificial oxide beneath the Poly-1 anchor to create a three-dimensional cavity.

Figure 2:
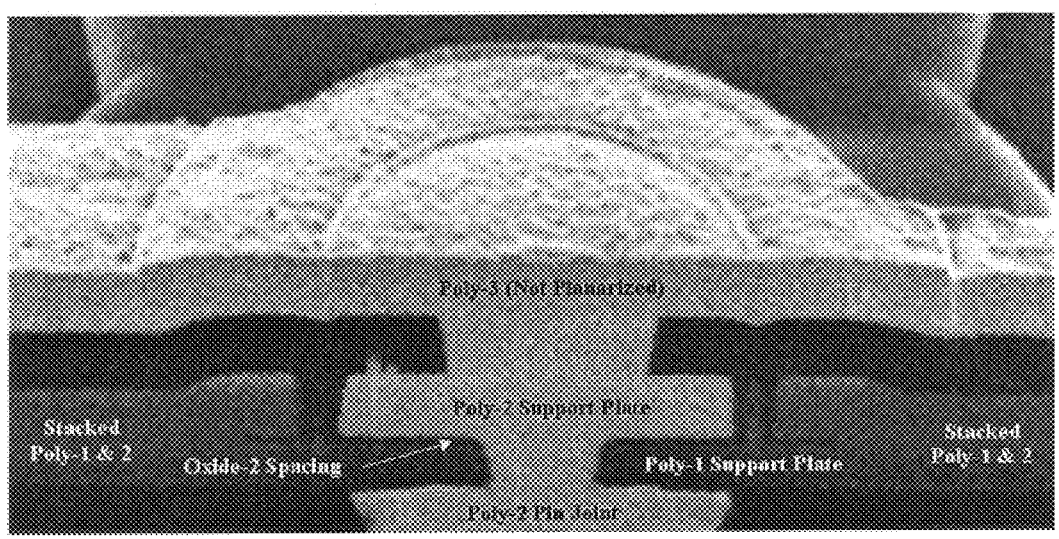
FIG. 2 contains a scanned image of micrograph of the enabling "pin-joint" used for rotating gear mechanisms.

The following deposition of a thin oxide layer (Oxide-2) will conform to the features of the Poly-1 anchor layer and to the inside wall of the cavity. As shown in FIG. 1b, the following deposition of Poly-2 creates a small column of structural material that is trapped by the original Poly-1 anchor layer. The mass of Poly-2 material that prevents the column from escaping the hold of the anchor layer is formed by the conformal deposition of the Poly-2 layer inside the etched cavity. The following Oxide-3 and Poly-3 layers are deposited to form the actual mirror surface, as shown in FIG. 1c, and then the device is released, as shown in FIG. 1d, to free the micromirror device for motion about the formed support joint. FIG. 2 shows a micrograph of such a "pin-joint" feature that was created for rotating gear mechanisms using the SUMMiT fabrication process.

This type of "pin-joint" uses the thin layer of Oxide-2 as the spacing between the hub of the gear and the surrounding Poly-1 support plate that anchors it to the substrate. Since this layer is so thin, the mechanical tolerance between the two structures is very small and is nearly ideal for rotating mechanisms. However, there is still a small degree of mechanical play in the joint and it is sufficient to allow for 10–15 degrees of tilt about the axis normal to the substrate.

Figure 3A:
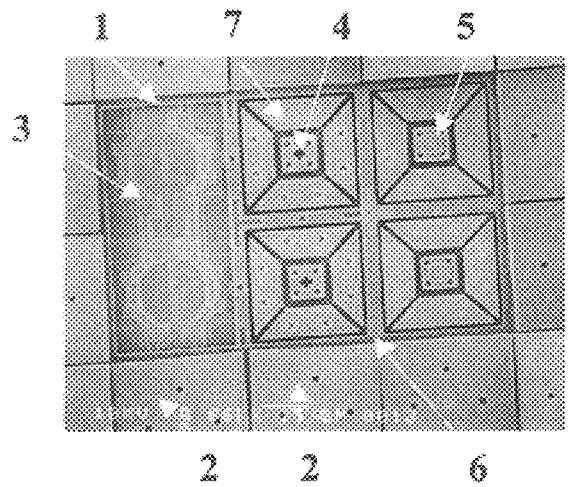
FIGS. 3a–3b show a scanned image of two arrays of flexureless micromirrors that use this "pin-joint" support design.

FIG. 3a shows an array of micromirrors with the center rectangle 1 containing six squares in successive stages of production. This rectangle is surrounded by square micromirrors 2 in various alignments. The left column of two squares shows the underlying wiring 3. The middle column corresponds to the FIG. 1 arrangement with the Poly-1 plate anchored at the four corners and a "pin-joint" cut in the shape of a "plus" 4 at the center of the anchor plate. In the right column, the small Poly-2 plate 5 is all that is visible of the "pin-joint" column to which the final Poly-3 mirror surface is anchored. This design allowed for the most significant amount of tilting (up to approximately ±18 degrees) as can be seen by the unactuated mirror surfaces 2 shown in the remainder of the array. The thin strips 6 shown between the devices are used for post-process metallization.

More importantly, however, they are used to provide a stable landing platform for the mirror surface once it is actuated. For these devices, the platforms create four stable switching positions around the edge of the mirror surface. The eight dots 7 in each square are the via holes attaching the wiring to the address electrodes.

Figure 3B:
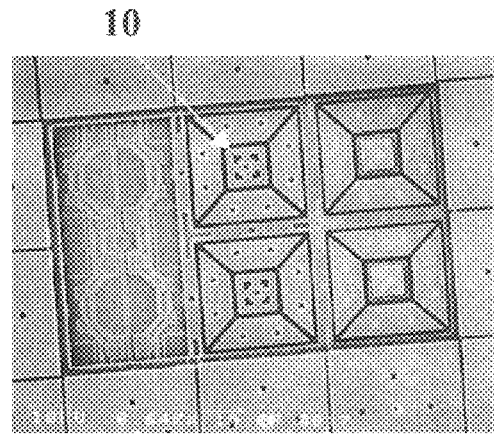

Likewise, FIG. 3b shows a similar device having a Poly-1 plate anchored at the center. This device uses four "pinjoint" cuts 10 at the corners of the plate to minimize adverse rotation. Note that the square micromirrors of FIG. 3b are more uniformly lined up since they have less rotational freedom than those in FIG. 3a.

Figure 4:
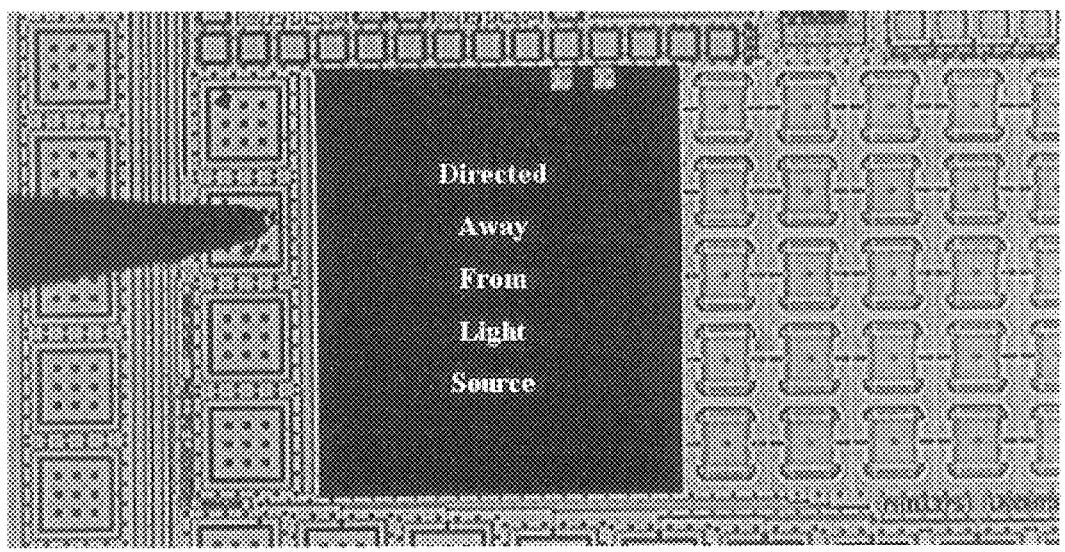
FIG. 4 shows a scanned image of one of these arrays actuated to one of the four stable switching positions.

These arrays are actuated electrostatically by applying an address potential between the mirror surface and the address electrode of choice. FIG. 4 illustrates the actuation of the array. It is an optical microscope image of a flexureless micromirror array actuated away from the light source (light enters from the right while the micromirrors are oriented toward the left). The dark cone on the left is a probe tip used here to actuate the electrodes. Each micromirror device in the array is switched to a stable position that deflects the incoming light source away from the microscope objective. Using voltages compatible with electronics, the flexureless micromirror device demonstrates its usefulness for multi-stable optical switching.

The key point is that the micromirrors are attached to the substrate by a flexible locking joint that gives them a certain freedom to be tilted. The micromirrors can be in various shapes. For example, round micromirrors can be actuated electrostatically to tilt in any direction while square mirrors can be tilted in one of four directions. The address electrode choice would depend on the mirror shape.

I claim:

1. A flexureless micromirror device in a structural assembly, comprising a micromirror surface attached to one or more support columns, said support columns being anchored to the structural assembly of the device by a flexible locking joint, whereby the mirror surface is free to move about the joint and the mirror surface can be electronically switched between multiple stable positions.

2. The flexureless micromirror device in claim 1, whereby said micromirror is attached by a single central support column and said support column is anchored to said structural assembly by a pin-joint.

3. The flexureless micromirror device in claim 1, whereby a square micromirror is attached by four support columns at its four corners and said support columns are anchored to said structural assembly by pin-joints.

* * * * *